United States Patent [19]

Schmid

[11] Patent Number: 5,736,773
[45] Date of Patent: Apr. 7, 1998

[54] PHOTODIODE WITH ANTIREFLECTION COATING

[75] Inventor: Wolfgang Schmid, Stuttgart, Germany

[73] Assignee: Wandel & Goltermann GmbH & Co. Elektronische Messtechnik, Eningen, Germany

[21] Appl. No.: 713,977

[22] Filed: Jun. 11, 1991

[30] Foreign Application Priority Data

Jun. 22, 1990 [DE] Germany ............... 40 19 853.7

[51] Int. Cl.$^6$ ............... H01L 31/0232; H01L 31/075; G02B 1/10
[52] U.S. Cl. ............... 257/437; 359/581; 257/458
[58] Field of Search ............... 357/30; 359/580, 359/581; 257/437

[56] References Cited

U.S. PATENT DOCUMENTS

| 3,958,042 | 5/1976 | Katsube et al. ............... 359/581 |
| 4,374,391 | 2/1983 | Camlibel et al. ............... 357/30 |
| 4,500,365 | 2/1985 | Mori ............... 357/91 |
| 4,649,088 | 3/1987 | Mitsui et al. ............... 359/580 |
| 4,893,162 | 1/1990 | Gentner et al. ............... 257/189 |

FOREIGN PATENT DOCUMENTS

| 0 372 929 | 6/1990 | European Pat. Off. . |
| 19 50 780 | 9/1971 | Germany . |
| 25 45 136 | 4/1976 | Germany . |
| 140 945 | 4/1980 | Germany . |
| 35 11 675 | 5/1985 | Germany . |

OTHER PUBLICATIONS

Sze Physics of Semiconductor Devices (Wiley, NY, 1981) pp. 744, 750, 849.

*Primary Examiner*—William D. Larkins
*Attorney, Agent, or Firm*—Herbert Dubno

[57] ABSTRACT

A photodiode having an antireflection coating for use in optical measuring devices has its antireflection coating so selected that it provides in a predetermined wavelength range an approximately constant conversion factor. The conversion of the light power to an electrical signal is thus substantially independent of wavelength over this wavelength range.

1 Claim, 3 Drawing Sheets

PHOTODIODE WITH ANTIREFLECTION COATING

FIELD OF THE INVENTION

My present invention relates to a photodiode with an antireflection coating and, more particularly, to a photodiode for use in optical measuring devices for the measurement of light power or amplitudes at wavelengths in the micrometer range.

BACKGROUND OF THE INVENTION

It is known to provide semiconductor photodiodes and receiving elements, i.e. light/electric-current transducers or converters, in optical communication technology and in measurement technology. The conversion process of light to electric current is wavelength dependent. An ideal photodiode with a quantum efficiency η which is reflection-free has thus the following characteristic:

$$r_{intrinsic}\left[\frac{A}{\omega}\right] \approx 0.8\eta \frac{\lambda}{\mu m}$$

The $r_{intrinsic}$ is characterized by an intrinsic conversion factor which increases with increasing wavelength even in the case of real photodiodes and is additionally influenced by the quantum efficiency η which in general is only approximately constant at mean wavelength region from about 1 μm to 1.5 μm and is also smaller than 100%. In addition, this conversion factor is influenced by the refractive index jump between air and semiconductor which influences the external reflection which results therefrom, this extrinsic reflection factor being described by the following equation:

$$r_{ext} = \left(\frac{n_L - n_{HL}}{n_L + n_{HL}}\right)^2$$

Typical values for $n_L$, the refractive index of the air and $n_{HL}$, the refractive index of the semiconductor are for $n_L=1$ and $n_{HL}=3.5$, $r_{ext} \approx 30\%$. The extrinsic reflection $r_{ext}$ reduces the total conversion factor and consequently in conventional diodes it is common to operate with a broad band antireflection coating. This has found widespread application in optical communications and optical information transfer technology where the broad band antireflection coating is optimized for a mean standard wavelength. This means that the wavelength-dependent curve of the eccentric reflection is caused to approximate as closely as possible the intrinsic curve. This fulfills a requirement of optical communications that the highest possible conversion factor for each wavelength utilized be provided.

To reduce measurement unreliability in optical measurement technology for different measurement wavelengths, it is known to compensate for the wavelength dependent conversion of individual photodiodes by storing the wavelength dependency of each photodiode independently in the measuring device and utilizing the characteristics of this dependency to collect the measurement result. Thus during the measurement process, the actual measurement wavelength is supplied by the user to allow the measurement device to automatically correct the conversion factor based upon the stored parameter.

However, for such a system to be practical, it is necessary that the measurement wavelength be known, which often is not the case. The known correction of the conversion factor in this manner can result, should there by deviations in the actual measurement wavelength from the given wavelength or should the measurement wavelength not be fully known, in significant errors in the measurement results.

OBJECTS OF THE INVENTION

It is, therefore, the principal object of the present invention to provide an improved photodiode which, for a given measurement range, can provide light amplitude or light power measurements with high precision even if the specific measurement wavelength is not known.

It is another object of this invention to provide a method of making high precision light intensity measurements with the aid of a photodiode whereby drawbacks of earlier systems are avoided.

Still another object of this invention is to provide an improved method of making a photodiode which has improved properties.

SUMMARY OF THE INVENTION

A photodiode for use in optical devices and capable of measuring the light amplitude or power of wavelengths in the micrometer range, according to the invention, can comprise:

a semiconductor having refractive index between 3 and 4 and constructed to receive incident light and to convert received incident light into an electrical signal; and an antireflection coating in the semiconductor in a path of the incident light and of a thickness d satisfying the relationship:

$$d = \frac{1}{8}\{(\lambda_{min}+\lambda_{max})2n\}$$

where n is the index of refraction of the antireflective coating, so that the photodiode has an approximately constant spectral transmission curve between a minimum wavelength $\lambda_{min}$ and a maximum wavelength $\lambda_{max}$.

The invention also comprehends a method of providing high precision light intensity measurement by a photodiode having a semiconductor with a refractive index between 3 and 4 and constructed to receive incident light and to convert the received incident light into an electrical signal, this method comprising applying to the semiconductor an antireflection coating in a path of the incident light and of a thickness d satisfying the relationship:

$$d = \frac{1}{8}\{(\lambda_{min}+\lambda_{max})2n\}$$

where n is the index of refraction of the antireflective coating, so that the photodiode has an approximately constant spectral transmission curve between a minimum wavelength $\lambda_{min}$ and a maximum wavelength $\lambda_{max}$.

The method of making a photodiode comprises the steps of:

(a) providing a semiconductor having refractive index between 3 and 4 and constructed to receive incident light and to convert received incident light into an electrical signal; and (b) applying to the semiconductor an antireflection coating in a path of the incident light and of a thickness d satisfying the relationship:

$$d = \frac{1}{8}\{(\lambda_{min}+\lambda_{max})2n\}$$

where n is the index of refraction of the antireflective coating, so that the photodiode has an approximately constant spectral transmission curve between a minimum wavelength $\lambda_{min}$ and a maximum wavelength $\lambda_{max}$.

The layer thickness of the antireflection coating is so selected, therefore, that in a predetermined measurement range, which, for example, can be between wavelengths of 1 μmm to 1.6 μm, there is an approximately constant spectral transmission curve. This is achieved in that the intrinsic transmission curve, by means of the antireflection coating, is compensated by the eccentric reflection curve such that for the desired wavelength range, an approximately constant transmission factor is obtained.

The antireflection coating is preferably a simple layer of silicon dioxide or the like, i.e. a single layer thereof. For the measurement range of 1 μm to 1.6 and a single layer of $SiO_2$ (n≈1.5), the layer thickness should be d=0.54 μm. The refractive index $n_{HL}$ of the semiconductor is about 3.5.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 3:
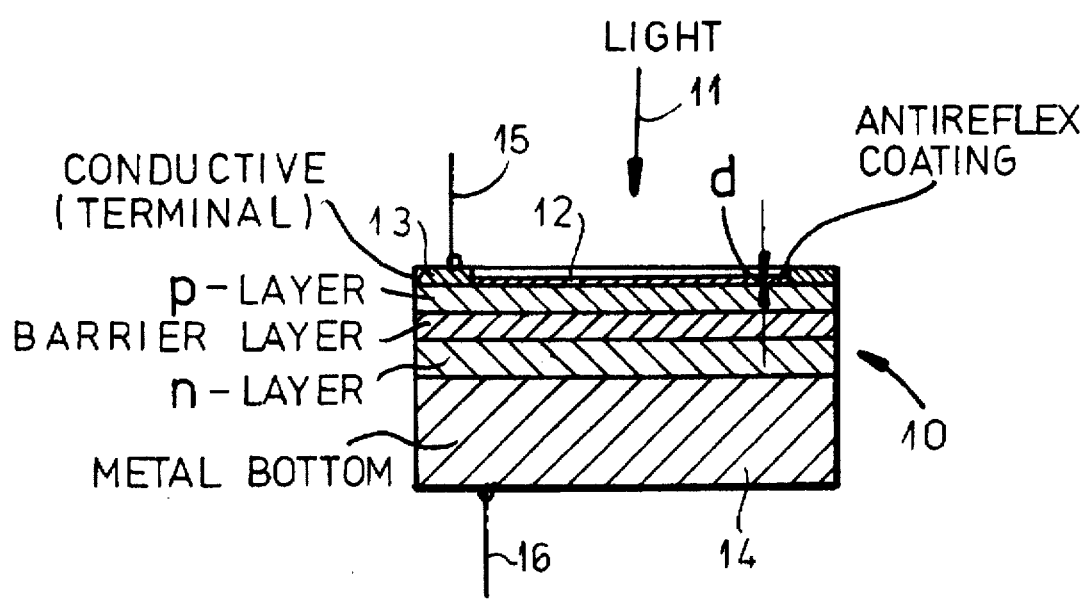
FIG. 3 is a diagrammatic perspective view of a photodiode according to the present invention.

Turning first to FIG. 3, it can be seen that a barrier-type semiconductor, not shown in detail but designated at 10, can form a photodiode receiving light as represented by an arrow 11 through an antireflection coating 12 of a refractive index of 1.5 and composed of a single layer of $SiO_2$ of a thickness d of 0.54 μm. At ohmic junctions with the semiconductor are metal coatings 13 and 14 forming terminals for the conductors 15 and 16 through which an electric current is caused to flow by the light impinging upon the semiconductor.

The antireflection coating 12 which is applied to the photodiode can also serve for passivation of the semiconductor. The coating may also be composed of $Si_3N_4$ and can have a refractive index of n≈1.5 to 2.0.

To achieve complete neutralization of reflection, two conditions must be fulfilled:

1. Amplitude condition:

$$n = \sqrt{n_L \cdot n_{HL}}$$

2. Phase condition: d=λ/4n wherein $n_L$ is the refractive index of air, n is the refractive index of the coating, and $n_{HL}$ is the refractive index of the semiconductor.

The neutralization usually is optimal only for a single wavelength. For the example given herein, the following is the case:

$$n = \sqrt{1 \cdot 3.5} = 1.87$$

For standard coating material having a refractive index of n≈1.5, therefore, the amplitude condition is not fulfilled so that even if the phase condition would be fulfilled, there is no complete neutralization of reflection.

In general, the reflection reduction can be treated as a three-layer problem as has been described for example, in "Prazisionsoptik", Spindler & Hoyer-Catalog 1987/88, page T2.

The power reflection factor can be calculated:

$$R = \frac{r_1^2 + r_2^2 + 2r_1r_2 \cdot \cos\frac{4\pi}{\lambda} \cdot nd}{1 + r_1^2 r_2^2 + 2r_1r_2 \cdot \cos\frac{2\pi}{\lambda} nd}$$

in which $$r_1 = \frac{n_M - n}{n_M + n} \text{ and}$$

$$r_2 = \frac{n - n_T}{n + n_T}$$

The transmission can then be calculated:

$$T = 1 - R = \frac{1 - r_1^2 - r_2^2 + r_1^2 r_2^2}{1 + r_1^2 r_2^2 + 2r_1r_2\cos\frac{4\pi}{\lambda} nd}$$

Figure 1:
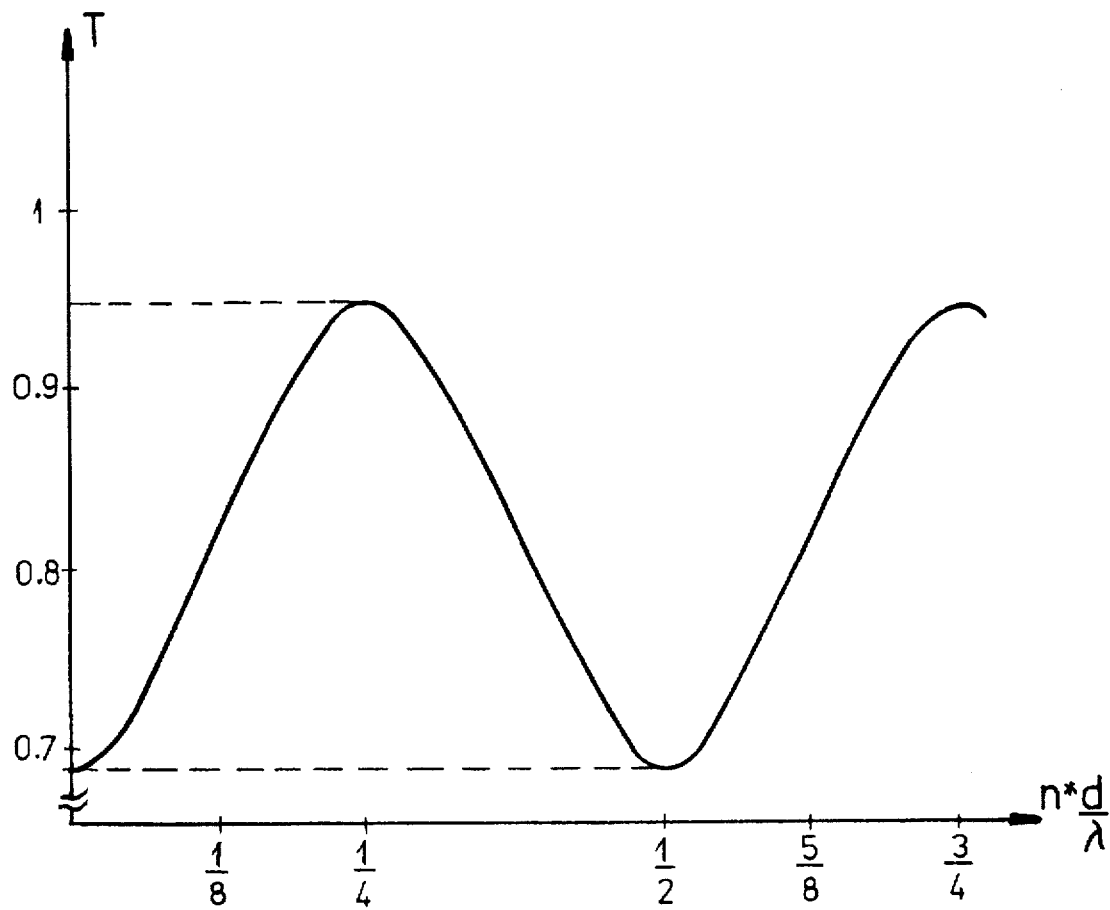
FIG. 1 is a graph showing the transmission curve of the antireflection coating which is dependent upon the layer thickness and the refractive index.

For the given case ($n_L=1$, n=1.5, $n_{HL}=3.5$), $r_1=0.2$ and $r_1^2=0.04$, $r_2=0.4$ and $R_2^2=0.16$. From this the transmission curve can be calculated as:

This transmission curve has been shown in FIG. 1.

A typical optimization for photodiodes in the long wave telecommunications range (1.3 to 1.5 μm) produces the maximum of the transmission and λ=1.3 μm, i.e. n.d/1.3 μm=¼. This corresponds to a layer thickness d of 0.22 μm and thus a wavelength dependent transmission curve as is represented at K1 in FIG. 2.

Figure 2:
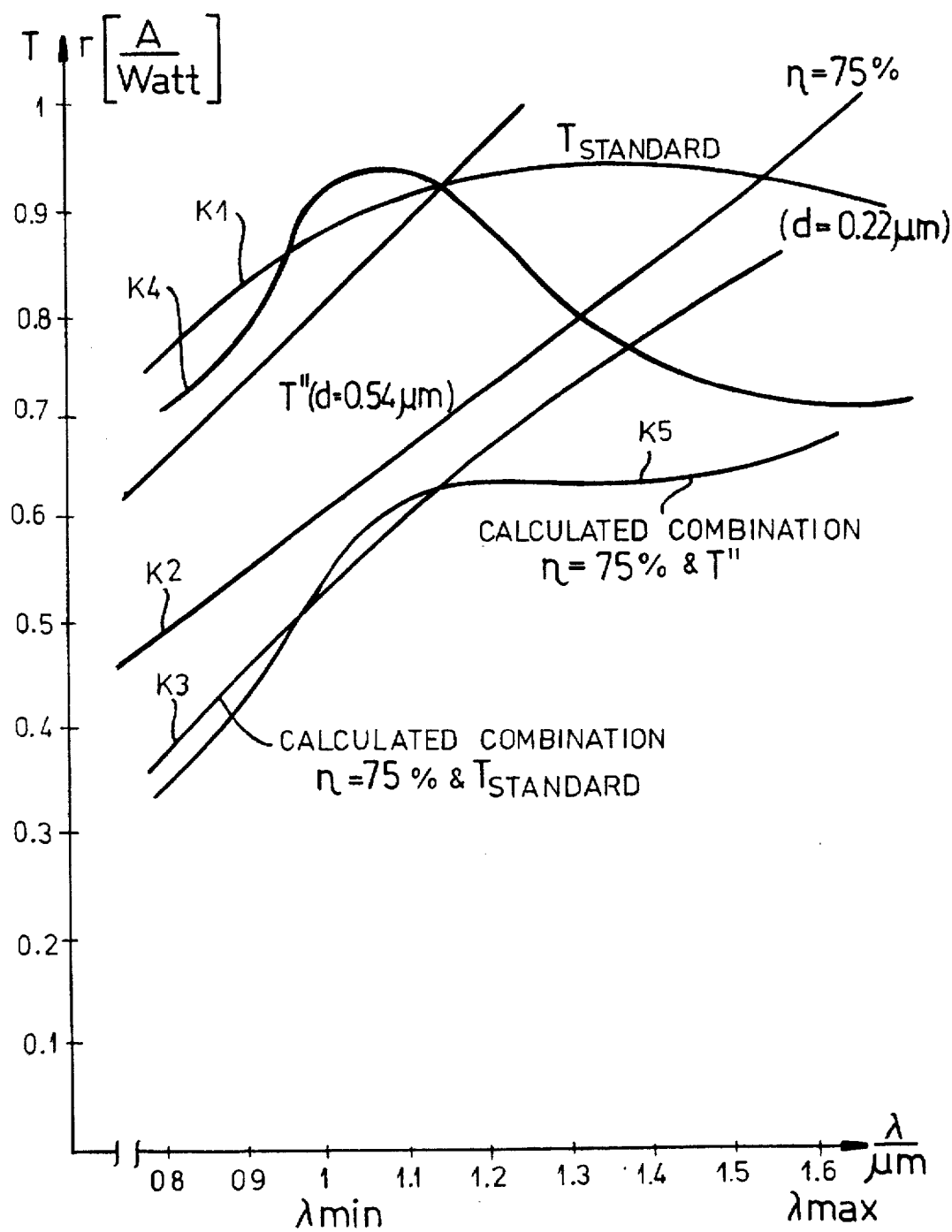
FIG. 2 shows, also in a graph, various wavelength-dependent transmission curves and conversion factors.

A typical quantum efficiency is about 75%, so that an intrinsic conversion factor corresponds to the curve K2 of FIG. 2. The total conversion factor is given by combining the curves K1 and K2 and has a characteristic K3.

The invention is based upon the discovery that it is possible to vary the layer thickness so that the wavelength dependency of the intrinsic conversion factor is compensated by the opposite tendency of the transmission of the antireflection coating. As can be seen from FIG. 1, one must then choose a thickness do so that the transmission T decreases with wavelength. Possible working points are $$\frac{nd}{\lambda} = \frac{1}{8}, \frac{5}{8}, \frac{9}{8}, \ldots$$

In addition, the working point must be so selected that, over the wavelength range $\lambda_{min}$ to $\lambda_{max}$ to be linearized, the slope of the extrinsic transmission curve is approximately equal to that of the intrinsic conversion factor. This is the case in the range $$\frac{1}{2} \leq \frac{nd}{\lambda} \leq \frac{3}{4}.$$

If, therefore, as is the case with the photodiode of the invention, the wavelength range of 1 μm to 1.6 μm is to be linearized, then the mean wavelength $$\lambda_M = \frac{\lambda_{min} + \lambda_{max}}{2} = 1.3 \, \mu m$$

should lie at the inflection point of the transmission curve, i.e. the layer thickness should be calculated from the following equation:

$$\frac{n \cdot d}{\lambda_M} = \frac{5}{8}$$

which is equivalent to $$d = \frac{5}{8}\{(\lambda_{min} + \lambda_{max})2n\}$$

From this equation for $n \approx 1.5$, the layer thickness $d=0.54$ µm. The spectral transmission curve for this system is represented by the characteristic K4 in FIG. 2 and the combination with the intrinsic conversion factor is seen in the characteristic K5. The characteristic K5 thus represents the total conversion factor r for the photodiode fabricated according to the invention, i.e. the photodiode having the thickness d of its antireflection coating in a single layer to provide over the wavelength range of about 1 µm to 1.6 µm an approximately constant total conversion factor.

I claim:

1. A photodiode for use in optical devices, said photodiode comprising:

a semiconductor having refractive index $n_{HL}$ of about 3.5 and constructed to receive incident light and to convert received incident light into an electrical signal;

terminals connected to said semiconductor for delivering said signal; and an antireflection coating in the form of a single layer of silicon dioxide on said semiconductor in a path of said incident light and of a thickness $d=0.54$ µm, an index of refraction $n=1.5$, and selected so that the photodiode has an approximately constant spectral transmission curve between a minimum wavelength $\lambda_{min}=1$ µm and a maximum wavelength $\lambda_{max}=1.6$ µm.

* * * * *